United States Patent
Viswanathan et al.

(10) Patent No.: US 9,922,894 B1
(45) Date of Patent: Mar. 20, 2018

(54) AIR CAVITY PACKAGES AND METHODS FOR THE PRODUCTION THEREOF

(71) Applicant: FREESCALE SEMICONDUCTOR INC., Austin, TX (US)

(72) Inventors: Lakshminarayan Viswanathan, Phoenix, AZ (US); Jaynal A. Molla, Gilbert, AZ (US); David Abdo, Scottsdale, AZ (US); Mali Mahalingam, Scottsdale, AZ (US); Carl D'Acosta, Mesa, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/269,629

(22) Filed: Sep. 19, 2016

(51) Int. Cl.
| | |
|---|---|
| *H01L 23/12* | (2006.01) |
| *H01L 23/66* | (2006.01) |
| *H01L 23/20* | (2006.01) |
| *H01L 23/047* | (2006.01) |
| *H01L 21/48* | (2006.01) |

(Continued)

(52) U.S. Cl.
CPC ............ *H01L 23/20* (2013.01); *B22F 1/0062* (2013.01); *B22F 3/10* (2013.01); *B23K 35/025* (2013.01); *B23K 35/30* (2013.01); *H01L 21/4817* (2013.01); *H01L 23/047* (2013.01); *H01L 23/057* (2013.01); *H01L 23/3675* (2013.01); *B22F 2301/10* (2013.01); *B22F 2301/255* (2013.01); *B22F 2302/45* (2013.01); *H01L 24/32* (2013.01); *H01L 24/49* (2013.01); *H01L 24/73* (2013.01); *H01L 2224/32225* (2013.01); *H01L 2224/32245* (2013.01); *H01L 2224/48091* (2013.01); *H01L 2224/48106* (2013.01); *H01L 2224/48177* (2013.01); *H01L 2224/73265* (2013.01); *H01L 2924/01042* (2013.01); *H01L 2924/15747* (2013.01); *H01L 2924/3511* (2013.01)

(58) Field of Classification Search
CPC . H01L 25/04–25/0756; H01L 23/552–23/556; H01L 23/562–23/576; H01L 2224/48177; H01L 23/20
See application file for complete search history.

(56) References Cited

U.S. PATENT DOCUMENTS

| 8,822,036 B1 | 9/2014 | Wereszczak |
| 9,099,567 B2 | 8/2015 | Viswanathan et al. |

(Continued)

*Primary Examiner* — Evan Pert
*Assistant Examiner* — Changhyun Yi

(57) ABSTRACT

Air cavity packages and methods for producing air cavity packages containing sintered bonded components, multipart window frames, and/or other unique structural features are disclosed. In one embodiment, a method for fabricating an air cavity package includes the step or process of forming a first metal particle-containing precursor layer between a base flange and a window frame positioned over the base flange. A second metal particle-containing precursor layer is further formed between the base flange and a microelectronic device positioned over the base flange. The metal particle-containing precursor layers are sintered substantially concurrently at a maximum processing temperature less than melt point(s) of metal particles within the layers to produce a first sintered bond layer from the first precursor layer joining the window frame to the base flange and to produce a second sintered bond layer from the second precursor layer joining the microelectronic device to the base flange.

14 Claims, 6 Drawing Sheets

(51) Int. Cl.
*H01L 23/057* (2006.01)
*H01L 23/367* (2006.01)
*B22F 3/10* (2006.01)
*B22F 1/00* (2006.01)
*B23K 35/02* (2006.01)
*B23K 35/30* (2006.01)
*H01L 23/00* (2006.01)

(56) References Cited

U.S. PATENT DOCUMENTS

| | | |
|---|---|---|
| 9,312,231 B2 | 4/2016 | Viswanathan |
| 2004/0212078 A1 | 10/2004 | Lee et al. |
| 2005/0224926 A1* | 10/2005 | Bambridge .......... H01L 23/047 257/666 |
| 2007/0172990 A1 | 7/2007 | Abdo et al. |
| 2013/0216848 A1 | 8/2013 | Kalich et al. |
| 2015/0115451 A1* | 4/2015 | Viswanathan .......... H01L 24/13 257/762 |

* cited by examiner

AIR CAVITY PACKAGES AND METHODS FOR THE PRODUCTION THEREOF

TECHNICAL FIELD

Embodiments of the present invention relate generally to microelectronic packaging and, more particularly, to air cavity packages and methods for producing air cavity packages containing sinter-bonded components, window frames, and/or other unique structural features.

BACKGROUND

Air cavity packages are usefully employed to house semiconductor die and other microelectronic devices supporting radio frequency (RF) functionalities. Notably, air cavity packages may provide certain performance benefits when housing microelectronic devices operable at relatively high radio frequencies, such as radio frequencies exceeding 100 megahertz and possibly approaching or exceeding 2.1 gigahertz. By conventional design, a leaded air cavity package includes a base flange, a window frame, a plurality of leads, and a cover piece, which are assembled and bonded in a stacked configuration. The base flange may serve as a substrate, a heat sink, and an electrically-conductive terminal of the package. Accordingly, the base flange may be realized as a monolithic or multilayer structure, which is predominately composed of copper or another metal having a relatively high thermal conductivity. In contrast, the window frame is produced from a dielectric material, such as a ceramic, to provide electrical insulation between the base flange and the package leads. The window frame may have a rectangular planform geometry and a central opening, which helps define an outer perimeter of the sealed air cavity. The cover piece is bonded over the window frame and package leads to enclose the air cavity. Prior to attachment of the cover piece, one or more microelectronic devices (e.g., RF semiconductor die) are installed within the air cavity, attached to an upper surface of the base flange, and electrically interconnected to the package leads by, for example, wirebonding.

BRIEF DESCRIPTION OF THE DRAWINGS

At least one example of the present invention will hereinafter be described in conjunction with the following figures, wherein like numerals denote like elements, and.

Figure 1:
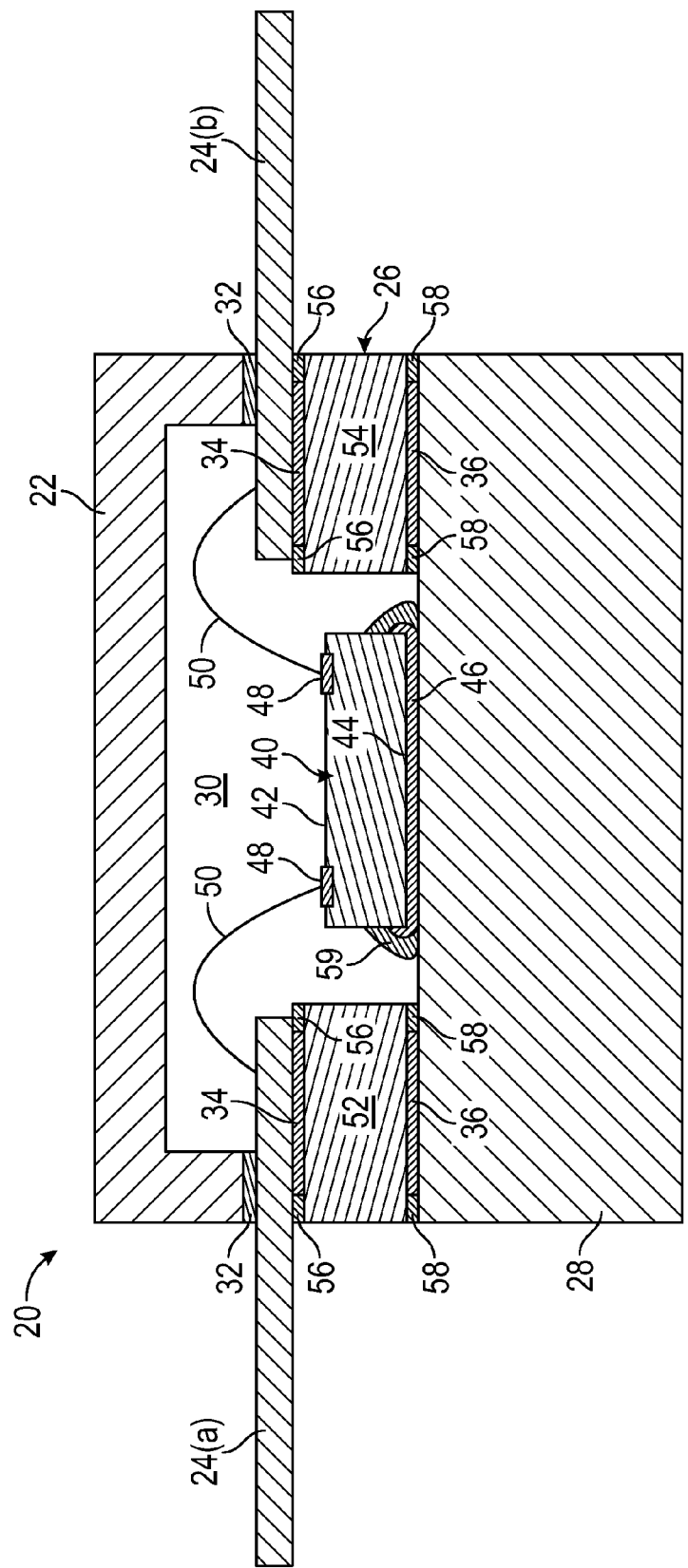
FIG. 1 is a cross-sectional view of a leaded air cavity package having at least one sintered bond layer, a multipart window frame, and a cover piece, as illustrated in accordance with an exemplary embodiment of the present disclosure.

For simplicity and clarity of illustration, descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. The term "exemplary," as appearing throughout this document, is synonymous with the term "example" and is utilized repeatedly below to emphasize that the following description provides only multiple non-limiting examples of the invention and should not be construed to restrict the scope of the invention, as set-out in the Claims, in any respect.

The term "air cavity package," as appearing throughout this document, refers to a microelectronic package including a sealed cavity that is at least partially filled with a gas, regardless of the internal pressure within the cavity. The "air cavity" of the air cavity package will often be enclosed in an open air environment and, thus, contain air at approximately 1 atmosphere (atm) pressure with slight variations depending upon elevation and processing temperatures during package manufacture. In other implementations, the "air cavity" of the air cavity package may be enclosed in a partially evacuated chamber or a chamber containing an inert gas, such as argon, during manufacture and, thus, may not contain pure air in all instances. The term "air cavity," then, should be understood as referring to a gas-containing cavity, which may or may not be partially evacuated and which is sealed from the ambient environment. Additionally, the seal formed between the air cavity and the ambient environment may not be hermetic, as strictly defined, but rather may be a low leakage seal having a gross leakage rate falling within acceptable parameters. Thus, as appearing herein, a cavity is considered "sealed" when little to no leakage (bubbles) are observed from the cavity's exterior when the cavity is filled with air or another gas and the air cavity package is fully immersed in a liquid (e.g., perfluoropolyether) at approximately 125 degrees Celsius (° C.). Finally, the term "window frame" is utilized to refer to a dielectric frame or isolation structure that at least partially surrounds an air cavity contained within an air cavity package.

Overview

As indicated in the foregoing section entitled "BACKGROUND," high performance air cavity packages can provide certain performance benefits, particularly when utilized to house microelectronic devices operable at relatively high radio frequencies exceeding 100 megahertz and, in certain cases, approaching or exceeding approximately 2.1 gigahertz (although the below-described air cavity packages can be utilized to house microelectronic die operable at lower frequencies or driven by direct currents). While a corresponding industry demand has developed for air cavity packages, the manufacturing costs associated with high performance air cavity packages remain undesirably high. Manufacture of high performance air cavity packages remains costly for multiple reasons, many of which are associated with the high temperature bonding processes often utilized to join the base flange, the window frame, and possibly the package leads in a stacked relationship. Consider, for example, when a metal brazing process is utilized during air cavity package fabrication. During metal brazing, the air cavity package is exposed to highly elevated temperatures exceeding the melt point of the selected braze material, which may approach or exceed 800° C. Such high temperature exposure may place undesired constraints on the materials from which the air cavity package components are fabricated and may necessitate that the respective Coefficients of Thermal Expansion (CTEs) of the package components are closely matched. Material costs are increased as a result. High temperature exposure during metal brazing can also result in distortion or warpage of the air cavity package components, such as the base flange. Such warpage can be addressed by trimming or otherwise removing the distorted regions of the base flange, but only with a corresponding penalty of increased scrap and elevated production costs. Alternatively, package warpage can be corrected through lapping or other post-braze processing steps; however, this again adds undesired cost and delay to the fabrication process.

In an alternative manufacturing approach, the components of an air cavity package are bonded utilizing a commercially-available pressure sensitive adhesive, such as an epoxy. Advantageously, the usage of an epoxy can avoid high temperature exposure of the air cavity package. However, relative to the metallurgically-bonded joints produced by brazing, the adhesive seals provided by a dispensed epoxy tend to be less robust and may allow an undesirably high gross leakage rate between the air cavity and the surrounding environment. Additionally, it may be difficult to control the layer thickness of the dispensed epoxy in a relatively precise manner across repeated iterations of the fabrication process. As a result, undesirable variances in the dielectric constant between the base flange and the package leads may occur between iterations of the fabrication process. Uncertainty may thus be introduced into the performance of the air cavity package when operating at high frequencies at which the base flange, the package leads, and the intervening epoxy layer act as a capacitive circuit element. Finally, regardless of whether an air cavity package is produced utilizing a low temperature epoxy-based assembly approach or a high temperature metal brazing approach, the production costs of the air cavity package may remain undesirably high for other reasons, as well, such as a non-optimal usage of the dielectric material from which the window frame is produced. There thus exists an ongoing need for methods by which high performance air cavity packages can be manufactured in a timely and cost-efficient manner.

The following provides embodiments of a cost efficient manufacturing process for producing high performance air cavity packages. In certain implementations of the manufacturing process, a low temperature sinter bond process is utilized to join two or more components of the air cavity package. The low temperature sinter bond process can be utilized to join the base flange and window frame, to join the window frame and package leads (in the case of a leaded package), and/or to attach the base flange and the microelectronic device or devices contained within the package. The sinter bond process advantageously provides robust metallurgical bonding and diffusion at one or more bond joint interfaces. Additionally, the sinter bond process is carried-out at limited maximum processing temperatures (e.g., maximum processing temperatures less than 300° C.) through the application of elevated heat, controlled convergent pressures, or both heat and convergent pressures. Prior to sintering, one or more sinter precursor layers are applied to selected interfaces of the air cavity packages by, for example, thin film transfer, screen printing, or utilizing another application technique. The sinter precursor layers contain metal particles, such as silver (Ag), copper (Cu), or gold (Au) metal particles, which are bonded and densified during the sintering process. The resulting sintered bond layers can be produced with little to no voiding, controlled porosities, and highly controlled thicknesses to optimize the mechanical, electrical, and leakage characteristics of the air cavity package. The sintered bond layers may lack organic materials or, instead, may contain organic materials to, for example, increase bond layer strength or pliability. As the sintering process is carried-out at relatively low temperatures, material constraints placed on the package components are eased and the above-described issues associated with high temperature processing (e.g., package warpage) are mitigated. Production costs are favorably lowered as a result. Furthermore, in at least some embodiments, the sintering process and other process steps are performed largely on a panel level (that is, by simultaneously processing a relatively large number of interconnected air cavity packages) to further reduce the cost and duration of air cavity package manufacture.

In addition to or as alternative to utilizing a low temperature sintering approach to bond the package components, reductions in manufacturing costs can be realized through the incorporation of multipart window frames into the air cavity packages. As compared to single piece or monolithic window frames, multipart window frames can be produced with little to no scrap by, for example, singulating a sheet or strip of dielectric material. However, when assembling a window frame from multiple parts or pieces, it is also desirable to minimize the number of joints formed by the window frame pieces. In this manner, the number of potential leakage paths and the volume of material required to seal the window frame joints is reduced. Thus, in certain embodiments, the multipart window frame may be assembled from two mating pieces (e.g., two L-shaped window frame pieces), which are combined to yield a generally rectangular window frame having two joints, as taken about the perimeter of the window frame. In other embodiments, one or more walls of the multipart window frame may be integrally formed with the cover piece or the base flange of the air cavity package. In still further embodiments, the multipart window frame may have other forms. In this manner, the material costs associated with the window frame can be minimized, while a high integrity, low leakage seal is still provided around the air cavity. A first exemplary embodiment of an air cavity package containing a multipart window frame and produced utilizing a low temperature sintering approach will now be described in conjunction with FIGS. 1-2.

Figure 2:
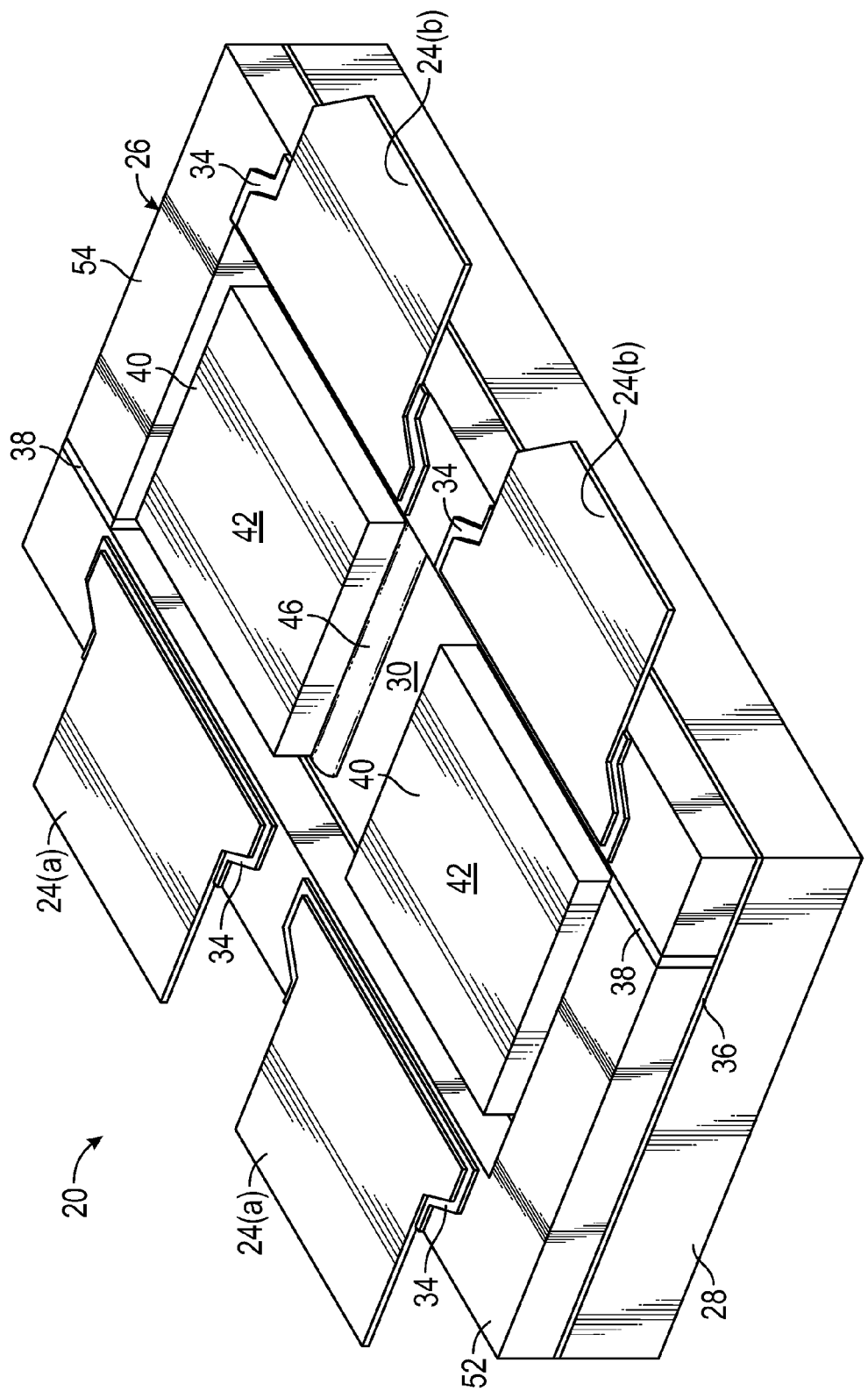
FIG. 2 is an isometric view of the exemplary air cavity package shown in FIG. 1 with the cover piece removed.

Non-Limiting Example of an Air Cavity Package Including a Multipart Window Frame and Sintered Bond Layers FIGS. 1 and 2 are cross-sectional and isometric views, respectively, of a leaded air cavity package 20, as illustrated accordance with an exemplary embodiment of the present disclosure. Generally progressing from top to bottom in FIGS. 1-2, air cavity package 20 includes a cover piece 22 (FIG. 1), a plurality of leads 24, a window frame 26, and a base flange 28. Cover piece 22 is removed in FIG. 2 to reveal the interior of air cavity package 20. An air cavity 30 is provided within package 20 and collectively defined by cover piece 22 (FIG. 1), leads 24, window frame 26, and base flange 28. During manufacture, air cavity 30 may be filled with air, filled with argon or another inert gas, or partially evacuated. A seal is formed around air cavity 30 such that relatively little, if any, leakage occurs between the interior of air cavity package 20 and its ambient environment. The seal formed around air cavity 30 may be hermetic or near hermetic; however, this is not necessary in all embodiments. Package bond layers 34, 36 are provided at the various interfaces between the assembled components of air cavity package 20. Package bond layers 34, 36 mechanically join the air cavity package components and help sealingly enclose air cavity 30. Window frame bond joints 38 (shown in FIG. 2) are also provided between the pieces of window frame 26 to further seal air cavity 30.

As shown most clearly in FIG. 2, two microelectronic devices 40 (e.g., semiconductor die, such as RF power transistor die) are installed within air cavity 30. Microelectronic devices 40 each include an upper principal surface or "frontside" 42 and an opposing lower principal surface or "backside" 44 (FIG. 1). Backsides 44 of microelectronic devices 40 are attached to the upper principal surface of base flange 28 by die bond layers 46. Circuitry may be formed on frontsides 42 of microelectronic devices 40, along with a number of bond pads 48 (shown in FIG. 1). As shown exclusively in FIG. 1, bond pads 48 are electrically coupled to package leads 24 by wire bonds 50. In alternative implementations, air cavity package 20 may be a no-lead package or another wiring approach may be employed to electrically interconnect bond pads 48 of devices 40 with the appropriate package terminals. In one embodiment, a first set of leads 24(a) projects from a first side of air cavity package 20 and serves as inputs that are electrically coupled to input terminals (e.g., gate terminals) of microelectronic devices 40; while a second set of leads 24(b) projects from a second, opposing side of package 20 and serves as outputs that are electrically coupled to output terminals (e.g., drain terminals) of microelectronic devices 40. Base flange 28 may itself serve as a ground reference terminal of air cavity package 20 (e.g., electrically coupled to source terminals of microelectronic devices 40), providing that die bond layers 46 are composed of an electrically-conductive material. While shown as containing two microelectronic devices 40 electrically coupled in parallel in the illustrated example, air cavity package 20 can contain any number and type of microelectronic devices in further embodiments, as well as other electrically-active components disposed in various different interconnection schemes. For example, in a further implementation, air cavity package 20 may contain two or more microelectronic devices 40 electrically coupled in series between package leads 24(a)-(b).

Base flange 28 can be any body of material, layered structure, or composite structure serving as a substrate upon which the remainder of air cavity package 20 is produced. In certain embodiments, and as previously noted, base flange 28 may serve as an electrically-conductive terminal of air cavity package 20 and, perhaps, as a heat sink or heat spreader. In one implementation, base flange 28 assumes the form of a monolithic metallic structure, plate, or slug. In other implementations, base flange 28 may itself assume the form of a printed circuit or wiring board. As a further possibility, base flange 28 may be produced from an organic material (e.g., a resin similar or identical to that from which printed circuit boards are produced) containing metal (e.g., Cu) coining. In still further embodiments, base flange 28 may have a multilayer metallic construction. In such embodiments, base flange 28 may contain multiple thermally-conductive layers, which are bonded in a stacked or laminated arrangement. In either case, base flange 28 will typically be composed predominately of one or more metals having relatively high thermal conductivies, such as Cu. For example, in an embodiment wherein base flange 28 is a layered or laminated structure, base flange 28 may include at least one Cu layer combined with at least one disparate metal layer having a CTE less than that of the Cu layer. The disparate metal layer may be composed of, for example, molybdenum (Mo), a molybdenum-copper (Mo—Cu) alloy, or a Mo—Cu composite material. In this manner, base flange 28 may be imparted with both a relatively high thermal conductivity and a lower effective CTE, which is more closely matched to that of microelectronic devices 40 and/or to that of window frame 26. Thermally-induced stress within air cavity package 20 can be reduced as a result.

In certain embodiments, window frame 26 is a multipart window frame produced from multiple pieces or parts, which are assembled and bonded to yield frame 26. Such a multipart window frame construction can enable an optimized usage of the window frame material to lower package production costs. In the exemplary embodiment shown in FIGS. 1-2, specifically, window frame 26 is produced from two window frame pieces 52, 54, which are assembled over base flange 28 and which are joined by window frame bond joints 38 (FIG. 2). Window frame pieces 52 and 54 are L-shaped structures each including two walls, which intersect at substantially perpendicular angles. Due to their respective L-shaped planform geometries, window frame pieces 52, 54 can be sealingly joined utilizing only two window frame bond joints 38, as taken about the perimeter of window frame 26. This beneficially reduces the number of potential leakage paths between air cavity 30 and the ambient environment, as well as the volume of material required to form bond joints 38. In further embodiments, the number of potential leakage paths can be reduced in another manner, such as by integrally forming one or more walls of window frame 26 with cover piece 22 or base flange 28, as described more fully below in conjunction with FIG. 7. Various other multipart constructions for window frame 26 are also possible. Finally, in still other embodiments of air cavity package 20, window frame 26 may not have a multipart construction and may, instead, be produced as a monolithic structure or unitary piece.

To help electrically isolate package leads 24 from each other and from base flange 28 (when electrically conductive), window frame pieces 52, 54 are each composed of a dielectric material. Suitable dielectric materials include, but are not limited to, alumina-based materials (e.g., zirconia-toughened alumina), glass materials, hydrocarbon-based materials containing ceramic and woven glass, liquid crystal polymers, low temperature co-fired ceramics, printed circuit board resins, polymers containing fillers (e.g., polytetrafluoroethylene containing a ceramic filler), and ceramics utilized in the fabrication of hybrid integrated circuits (e.g., barium titanate), to list but a few examples. In one embodiment, window frame pieces 52, 54 are produced from an organic material. Similarly, cover piece 22 is also usefully produced from a dielectric material, such as those listed above, and may or may not be composed of the same material as is window frame 26. Finally, package bond layer 32 is also produced from a dielectric bonding material to avoid electrical bridging of package leads 24, while further bonding cover piece 22 to leads 24 and window frame 26 in a manner forming a low leakage seal around the interfaces between these components. Materials suitable for usage as package bond layer 32 include pressure-sensitive adhesives, such as epoxies and other die attach materials.

In the illustrated example shown in FIGS. 1-2, package bond layers 34, 36 are produced as sintered bond layers and are consequently referred to hereafter as "sintered bond layers 34, 36." Sintered bond layers 34, 36 are each produced from a metal particle-containing precursor material, which is densified into a substantially coherent mass or layer during a low temperature sintering process. The particular composition of sintered bond layers 34, 36 will vary amongst embodiments, depending upon the initial formulation of the metal particle-containing precursor material and the parameters of the sintering process. Further discussion in this regard is provided below. As an initial matter, however, it is generally noted that sintered bond layers 34, 46 may be predominately composed of at least one metal, as considered by weight percentage (wt %). In one embodiment, sintered bond layers 34, 36 are each predominately composed of Cu, Ag, Au, or a mixture thereof, again as considered by weight. Sintered bond layers 34, 36 may or may not contain organic materials. In certain implementations, sintered bond layers 34, 36 may be essentially free of organic materials; the term "essentially free," as appearing herein, is defined as containing less than 1 wt % of organic materials. In other embodiments, sintered bond layers 34, 36 may contain selected organic materials or fillers to tailor the properties of bond layers 34, 36. For example, in certain instances, sintered bond layers 34, 36 may contain an epoxy or another organic material, as described below.

Depending upon the respective compositions of sintered bond layers 34, 36, the operational environment of air cavity package 20 (e.g., heat exposure and humidity levels), and the operational parameters of package 20 (e.g., electrical potentials), sintered bond layers 34, 36 may have tendency to gradually migrate or travel over time. Bond layer migration may be particularly pronounced in embodiments wherein sintered bond layers 34, 36 are largely or wholly composed of one or more metals prone to migration, such as Ag. In such embodiments, air cavity package 20 may be produced to further include certain structural features, which serve to minimize or prevent bond layer migration. In this regard, and as illustrated in FIG. 1, a number of sinter containment layers or beads 56 may be formed around the peripheries of one or more of sintered bond layers 34, 36. Sinter containment beads 56 are usefully formed along one or more peripheries of sintered bond layers 34, 36 to prevent undesired migration of the sinter bond material; e.g., one sinter containment bead 56 may be deposited along the inner periphery of sintered bond layer 34 and other containment beads 56 may be deposited around the peripheries of sinter bond layers 36 to deter migration of the (e.g., Ag-containing) sinter bond material toward the interior of air cavity package 20 and the electrically-conductive components contained therein. Sinter containment beads 56 can be produced from an epoxy or another polymeric material suitable for usage as a dam or blockade feature, which physically impedes or blocks undesired ingress of sintered bond layers 34, 36 toward the interior of air cavity package 20. For process efficiency, sinter containment beads 56, 58 can be co-dispensed with the precursor material form which sintered bond layers 34, 36 are formed, as described more fully below in conjunction with FIG. 4.

In certain embodiments of air cavity package 20, die bond layers 46 can be produced as sintered bond layers, which are similar or identical in composition to sintered bond layers 34, 36. When produced as a sintered bond layers, die bond layers 46 may be produced in conjunction with sintered bond layers 34, 36. More specifically, a common application process may be utilized to apply the precursor material from which die bond layers 46 are formed along with the precursor material from which sintered bond layers 34, 36 are formed; e.g., die bond layers 46 may be applied as a film, a dispensed paste, or a screen printed paste, as described below. A common sintering process may then be carried-out to transform the precursor layers into sintered bond layers 34, 36 and die bond layers 46. The following description notwithstanding, die bond layers 46 may not be produced as sintered bond layers in all embodiments. Instead, in other embodiments, die bond layers 46 may be produced from a die attach material (e.g., an electrically-conductive epoxy), which is dispensed or otherwise applied at the respective interfaces between microelectronic devices 40 and base flange 28 prior to wirebonding and attachment of cover piece 22 (and, thus, after joinder of base flange 28, window frame 26, and package leads 24). If desired, and as further indicated in FIG. 1, a containment layer or bead 59 may also be provided around the outer periphery of die bond layers 46 when composed of sintered material prone to migration. An exemplary embodiment process for fabricating bond layers 34, 36, 46, and, more generally, air cavity package 20 will now be described in conjunction with FIG. 3.

Examples of Air Cavity Package Fabrication Methods

In certain embodiments, air cavity package 20 can be produced as a discrete unit utilizing a pre-singulated base flange such that additional singulation of package 20 during or after the primary package fabrication process is unnecessary. Generally, however, manufacturing cost and efficiency can be optimized by producing air cavity package 20 along with a relatively large number of other air cavity packages in parallel by globally processing a single, relatively large structure (referred to herein as a "base flange panel"). Such a panel level manufacturing process may be carried-out by performing certain process steps globally across the base flange panel to concurrently produce the air cavity packages and, when the package fabrication process is partially or fully completed, singulating the panel to separate the air cavity packages into discrete units. One such panel level manufacturing process suitable for producing air cavity package 20 along with a number of substantially identical air cavity packages will now be described in conjunction with FIG. 3. The following manufacturing method is provided by way of non-limiting example only and with the understanding that the below-described process steps can be performed in alternative orders, that certain steps may be omitted, and that additional steps may be performed in alternative embodiments. Description of structure and processes known within the microelectronic packaging industry may be limited or entirely omitted without providing the well-known process details.

Figure 3:
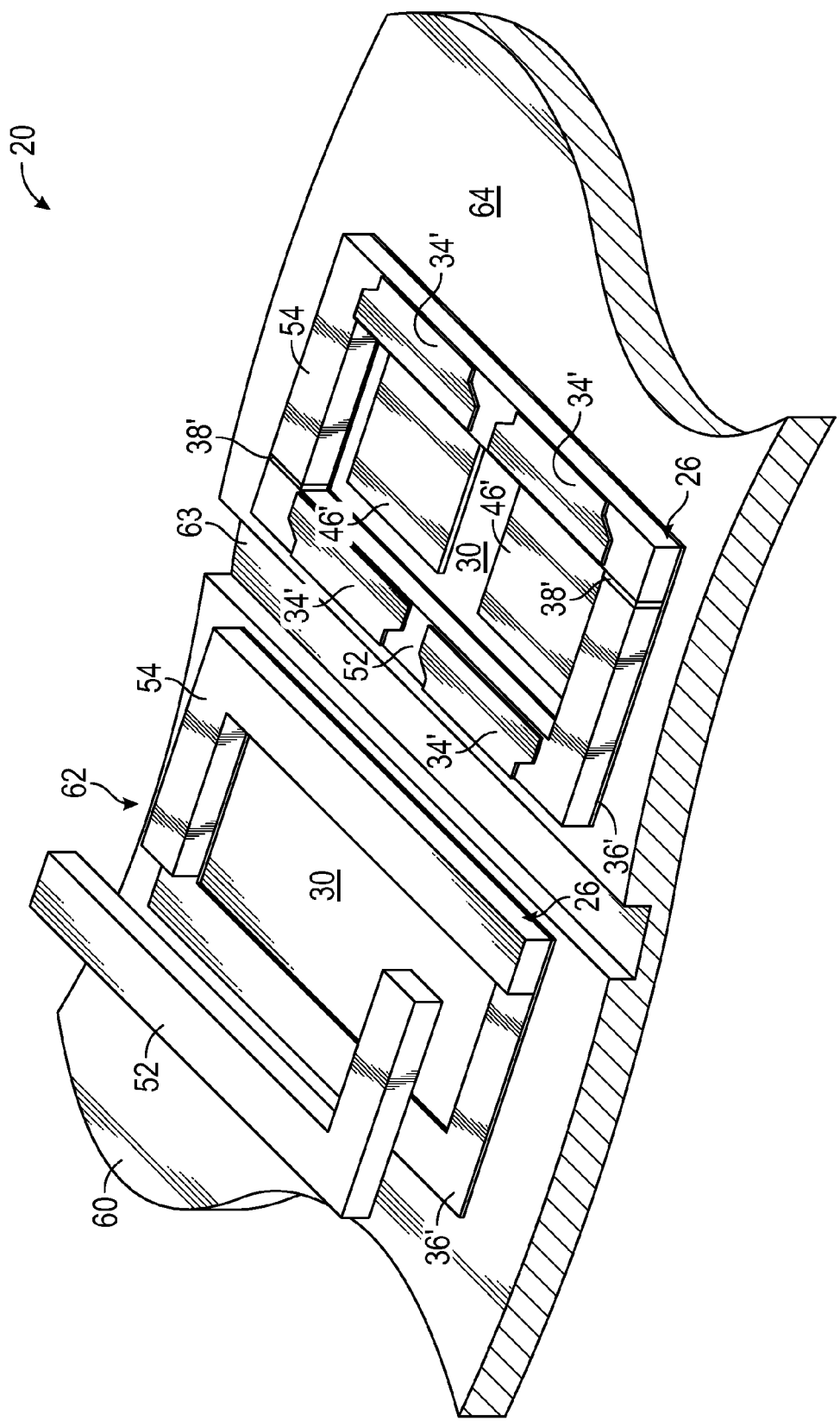
FIG. 3 is an isometric cutaway view illustrating an exemplary manner in which the air cavity package shown in FIGS. 1-2 can be produced in parallel with a plurality of other air cavity packages by processing a base flange panel (partially shown)

FIG. 3 is an isometric view of a base flange panel 60 (partially shown), which can be processed to produce air cavity package 20 along with a plurality of similar air cavity packages (one of which is shown to the left of package 20 and identified by reference numeral "62"). Base flange panel 60 is, in essence, a relatively large structure (as considered from a top-down or planform viewpoint) containing a plurality of base flanges interconnected in an edge-to-edge relationship. Air cavity packages 20, 62 are depicted in a partially completed state in FIG. 3, with air cavity package 20 shown at a slightly later juncture in the fabrication process than is air cavity package 62. While only a limited portion of panel 60 is shown, it will be appreciated that base flange panel 60 will typically be considerably larger than the illustrated panel portion so that that the below-described process steps are performed globally across panel 60 to produce multiple additional air cavity packages in conjunction with air cavity packages 20, 62. Air cavity packages 20, 62, and the other, non-illustrated air cavity packages produced across panel 60 can be substantially identical or may instead vary in form and/or function.

In the exemplary embodiment shown in FIG. 3, base flange panel 60 is illustrated as a monolithic, homogenous structure. For example, base flange panel 60 may be a monolithic sheet or plate composed of a metallic material, such as relatively pure Cu or a Cu-based alloy. In further embodiments, base flange panel 60 may be a composite structure, such as a structure composed of a metal (e.g., Cu) body having coining (e.g., Mo, Ag, or Au) therein. In still further embodiments, base flange panel 60 can assume the form of a multilayer or laminated structure of the type previously described in conjunction with base flange 28 of air cavity package 20 (FIGS. 1-2). In this case, base flange panel 60 may be produced by bonding a plurality of metal sheets in a stacked or laminated configuration. In such embodiments, the metal sheets may be bonded by hot rolling, cold rolling, metal brazing, or utilizing a low temperature metal sintering process similar to that described herein. Additional discussion of multilayer base flanges (alternatively referred to as "multilayer heat sinks") is provided in the following co-pending U.S. patent application, which is hereby incorporated by reference: U.S. patent application Ser. No. 15/223,307, filed with the United States Patent and Trademark Office on Jul. 29, 2016, and entitled "SINTERED MULTILAYER HEAT SINKS FOR MICROELECTRONIC PACKAGES AND METHODS FOR THE PRODUCTION THEREOF."

To produce the sintered bond layers included within air cavity packages 20, 62 and the other non-illustrated air cavity packages, metal particle-containing precursor layers are applied to selected surfaces of the air cavity package components. Examples of such metal particle-containing sinter precursor layers are shown in FIG. 3 and identified utilizing reference numerals corresponding to the sintered bond layers, but with the addition of a prime symbol ("'"). For example, the metal particle-containing precursor layers utilized to produce sintered bond layers 36 (FIGS. 1-2) are show in FIG. 3 and identified by reference numerals "36'." As can be seen, metal particle-containing precursor layers 36' have been applied over selected regions of base flange panel 60 and imparted with planform shapes (and dimensions) generally corresponding to the respective planform shapes (and dimensions) of window frames 26. Metal particle-containing precursor layers 36' are usefully screen printed, transferred as a film, or otherwise deposited across upper surface 64 of base flange panel 60. However, it is also possible that precursor layers 36' may be applied to the undersides of window frame pieces 52, 54 prior to window frame placement in addition to or as an alternative to the application of precursor layers to base flange panel 60. Processes suitable for applying metal particle-containing precursor layers 36' to selected surfaces of base flange panel 60 and/or window frame pieces 52, 54 are discussed more fully below.

In embodiments wherein die bond layers 46 are produced as sintered bond layers, corresponding metal particle-containing precursor layers may also be applied over base flange panel 60 prior to, after, or in conjunction with metal particle-containing precursor layers 36'. This is indicated in FIG. 3 for air cavity package 20, exclusively, wherein reference numeral "46'" is utilized to identify the metal particle-containing precursor layers from which die bond layers 46 are formed. If desired, precursor layers 36', 46' may be co-deposited utilizing a wet state application technique, such as a computer-controlled needle dispense process or a screen/stencil printing process of the type described below. As another example, precursor layers 36', 46' may be simultaneously applied to upper surface 64 of base flange panel 60 utilizing a global film transfer process, as further described below. These examples notwithstanding, metal particle-containing precursor layers 46' need not be formed in conjunction with precursor layers 36' in all instances. Furthermore, die bond layers 46 (FIGS. 1-2) may not be formed as sintered bond layers in other embodiments. For example, in further embodiments, die bond layers 46 may be formed by dispensing an epoxy or other die attach material prior to attachment of microelectronic devices 40, wirebonding, and attachment of cover piece 22 (FIG. 1).

After application of metal particle-containing precursor layers 36' and possibly precursor layers 46', window frame pieces 52, 54 are positioned on base flange panel 60 utilizing, for example, a pick-and-place tool. Window frame bond joints 38 (FIG. 2) are then formed to sealingly join window frame pieces 52, 54. Window frame bond joints 38 (FIG. 2) can also be produced as sintered bond joints formed from a number of metal particle-containing precursor layers 38', as shown in FIG. 3 for air cavity package 20. When provided, precursor layers 38' can be applied after placement of window frame pieces 52, 54 utilizing a needle dispense process or another backfill technique. Alternatively, precursor layers 38' can be applied to the appropriate regions of window frame pieces 52, 54 prior to placement of window frame pieces 52, 54 onto base flange panel 60. As noted above, window frame pieces 52, 54 can be produced from various different dielectric materials including ceramics and organic materials, such as plastics. The external surfaces of window frame pieces 52, 54 may be left bare or, alternatively, one or more of the frame piece surfaces may be plated or coated. For example, in one embodiment, the lower surfaces of window frame pieces 52, 54 may be metallized or plated (e.g., by sputter depositing a metal film) to facilitate metallurgical bonding with sintered bond layers 36 (FIGS. 1-2) formed from precursor layers 36' (FIG. 3).

As further shown in FIG. 3 for air cavity package 20, the metal particle-containing precursor layers utilized to produce sintered bond layers 34 (identified by reference numerals "34'") are next applied to the upper surfaces of window frame pieces 52, 54. Again, metal particle-containing precursor layers 34' can be applied to window frame pieces 52, 54 prior to placement of pieces 52, 54 on base flange panel 60, but are more conveniently formed after window frame piece placement utilizing one of the application techniques described below. Afterwards, package leads 24 are positioned in contact with metal particle-containing precursor layers 34' as generally shown in FIG. 2. Package leads 24 can be positioned on an individual lead-by-lead basis utilizing a pick-and-place tool. Alternatively, package leads 24 may be joined in an interconnected leadframe array, which generally spans base flange panel 60 and which is subsequently separated into individual leads during the below-described panel singulation process. Package leads 24 can be fabricated from various different metals and alloys. In one embodiment, package leads 24 are stamped from, laser cut from, or otherwise produced from a Cu sheet. As are the external surfaces of window frame pieces 52, 54, the external surfaces of package leads 24 may be may be left bare, coated, or plated to promote the desired metallurgical bonding with sintered bond layers 34, 36 (FIGS. 1-2).

The metal particle-containing precursor layers can be sintered utilizing a common sintering process or a series of sequentially-performed sintering steps. When die bond layers 46 (FIG. 1) are produced by sintering metal particle-containing precursor layers 46' (FIG. 3), microelectronic devices 40 are positioned in contact with precursor layers 46' prior to sintering. When die bond layers 46 (FIG. 1) are instead produced utilizing a non-sintered adhesive, such as an epoxy or other die attach material, die bond layers 46 may be dispensed in the appropriate locations after sintering and then microelectronic devices 40 may be pressed into or seated on die bond layers 46. In either case, cover pieces 22 are installed over window frames 26 and package leads 24 to enclose air cavities 30 after attachment of microelectronic devices 40 and wirebonding. Referring specifically to air cavity package 20 shown in FIGS. 1-2, bond layer 32 may be applied around the lower peripheral edge of cover piece 22 or, instead, bond layer 32 may be applied as a relatively thick bead around the upper peripheral surface of window frame 26 and over package leads 24. Bond layer 32 is applied to a thickness sufficient to fill the gaps between the upper peripheral edge of window frame 26 and the lower peripheral edge of cover piece 22 in those locations at which package leads 24 are not present. In this manner, bond layer 32 and cover piece 22 cooperate to sealingly enclose air cavity 30 after microelectronic devices 40 have been installed within cavity 30 and interconnected with the appropriate bond pad shelves of package leads 24. Bond layer 32 can be, for example, a dispensed epoxy or a B-stage epoxy in an embodiment.

Cover piece attachment can be performed after or prior to singulation of base flange panel 60 (FIG. 3). In one embodiment, base flange panel 60 (FIG. 3) is singulated after cover piece 22 is attached to window frame 26 of air cavity package 20 and a plurality of other, non-illustrated cover pieces are attached to the other air cavity packages produced across panel 60 including air cavity package 62. Singulation of base flange panel 60 separates panel 60 into multiple, discrete pieces, which serve as the base flanges or heat sinks of the completed air cavity packages. Thus, in the specific case of air cavity package 20, a singulated piece of base flange panel 60 forms base flange 28 shown in FIGS. 1-2. Processes suitable for singulating base flange panel 60 include, but are not limited to, sawing, laser cutting, water jetting, stamping, scribing with punching, and routing. As indicated in FIG. 3, base flange panels 60 may include thinned portions 63 (e.g., half-etch features or trenches defining saw lanes) or similar thinned structures (e.g., spars or tie bars extending between adjoining base flanges) to facilitate the singulation process. In certain cases, air cavity package 20, air cavity package 62, and the other air cavity packages produced across base flange panel 60 may be initially produced by a first entity (the "package supplier") and distributed to a secondary entity (the "customer") prior to cover piece attachment and without installed microelectronic devices. The customer may then install the desired microelectronic devices (e.g., semiconductor die) within the acquired air cavity packages, subsequently attach the cover pieces, and then release the packaged devices into the commercial marketplace.

There has thus been provided cost efficient methods for fabricating high performance air cavity packages including sintered bond joints and multipart window frames. Additional description of the manner in which the sintered bond joints can be produced will now be provided by way of non-limiting example. The following description notwithstanding, the air cavity packages need not include sintered bond joints in all implementations of the present disclosure. For example, in certain embodiments, the air cavity packages may be produced to include multipart window frames, while the components of the air cavity packages and the window frame joints are bonded and sealed utilizing a low temperature adhesive or epoxy, such as a polyimide film. It is, however, generally preferred that the air cavity package includes at least one sinter bond layer formed in contact with the window frame, as described more fully below.

Examples of Sintered Bond Layer Compositions and Formation Processes

The above-described metal particle-containing precursor layers (e.g., precursor layers 34', 36', 38', 46' shown in FIG. 3) can be applied in various different manners including both wet state and dry state application techniques. Suitable wet state application techniques include, but are not limited to, screen or stencil printing, doctor blading, spraying, dipping, and fine needle dispense techniques. When a wet state application technique is employed, a flowable or wet state coating precursor material is initially obtained by, for example, independent production or purchase from a third party supplier. In addition to metal particles (described below), the wet state coating precursor material contains other ingredients (e.g., a solvent and/or surfactant) to facilitate wet set application, to adjust the viscosity of the precursor material, to prevent premature agglomeration of the metal particles, or to serve other purposes. In one embodiment, the wet state coating precursor material contains metal particles in combination with a binder (e.g., an epoxy), a dispersant, and a thinner or liquid carrier. The volume of solvent or liquid carrier contained within the coating precursor material can be adjusted to tailor of the viscosity of the precursor material to the selected wet state application technique. For example, in embodiments wherein the precursor material is applied by screen printing or doctor blading, the coating precursor material may contain sufficient liquid to create a paste, slurry, or paint. After application of the wet state coating material, a drying process can be carried-out to remove excess liquid from the metal particle-containing precursor material, if so desired.

In further embodiments, the metal particle-containing precursor layers can be applied utilizing a dry state application technique. For example, a film transfer process can be employed to apply precursor layers 36' (and possibly precursor layers 46') to the appropriate surfaces of base flange panel 60 (FIG. 3), to apply precursor layers 34' to window frames 26, or to apply both precursor layers 34', 36'. In this regard, a dry film may first be prepared by, for example, initially depositing (e.g., screen printing or otherwise dispensing) one or more metal particle-containing precursor layers onto a temporary substrate or carrier, such as a plastic (e.g., polyethylene terephthalate) tape backing. The metal particle-containing precursor layers may be applied to the carrier in a wet, flowable state and then heated or otherwise dried to yield a dry film, which is transferred to the appropriate package component surfaces. Heat, pressure, or both heat and pressure are then applied to adhere the metal particle-containing precursor layer (dry film) to the appropriate component surfaces. The carrier (e.g., tape backing) may then be removed by physical removal (e.g., peeling away) or by dissolution in a chemical solvent. This process may then be repeated to apply additional metal particle-containing precursor layers to other component surfaces, as appropriate. In still further embodiments, one or more freestanding films may simply be positioned between the air cavity package components during the stacking or build-up process (also considered "film transfer" in the context of this document) by, for example, positioning a freestanding film over base flange panel 60 prior to placement of window frame pieces 52, 54 (FIG. 3).

The metal particles dispersed within the metal particle-containing precursor layers (e.g., precursor layers 34', 36', 38', 46' shown in FIG. 3) can have any composition, shape, and size enabling the particles to form a substantially coherent adhesive layer pursuant to the below-described sintering process. In one embodiment, the metal particle-containing precursor layers contain Au, Ag, or Cu particles, or a mixture thereof. In another embodiment, the metal particles contained within the precursor layers consist essentially of Ag or Cu particles. The metal particles contained within the precursor layers may or may not be coated with an organic material. For example, in some implementations, the metal particles may be coated with an organic dispersant, which prevents physical contact between the particles to inhibit premature agglomeration or particle sintering. When present, any such organic particle coating may be burned away or thermally decomposed, whether in whole or in part, during the below-described metal sintering process. In still further embodiments, other material systems amenable to low temperature sintering, whether currently known or later developed, may be utilized in the air cavity fabrication process.

The metal particles contained within the precursor layers can have any shape or combination of shapes including, but not limited to, spherical shapes, oblong shapes, and platelet or laminae shapes. The average dimensions of the metal particles will vary in conjunction with particle shape and process parameters. However, in general, the average maximum dimension of the metal particles (e.g., the diameter of the metal particles when spherical or the major axis of the metal particles when oblong) may be between about 100 microns (µm) and about 10 nanometers (nm) in an embodiment. In other embodiments, the metal particles may have average maximum dimension greater than or less than the aforementioned range. In certain implementations, a mixture of metal particles having average maximum dimensions in both the nanometer and micron range may be present within the precursor material. In other implementations, only nanoparticles (that is, particles having average maximum dimension between 1 and 1000 nm) may be contained within the metal particle-containing precursor layers. As a specific, albeit non-limiting example, the precursor layers may contain at least one of Ag, Au, or Cu nanoparticles or micron-sized particles in an embodiment, with Ag or Cu nanoparticles being preferred.

After application of the metal particle-containing precursor layers, a low temperature sintering process is performed to produce the desired sintered bond layers. The low temperature sintering process can be carried-out under any process conditions suitable for transforming the metal particle-containing precursor layers into sintered bond layers, noting that some diffusion may occur from the precursor layers into contacting components of the air cavity packages. The sinter bond process thus advantageously forms low stress, mechanically-robust, solid state metallurgical diffusion bonds at the bond joint interfaces. The sintering process may be performed with or without pressure, with or without heating (although some degree of elevated heat will typically be applied), and in any suitable atmosphere (e.g., open air or in the presence of an inert gas, such as nitrogen). As a point of emphasis, the sintering process is carried-out at maximum processing temperatures ($T_{MAX}$) less than the melt point of the metal particles contained within the precursor layers. Indeed, in many embodiments, $T_{MAX}$ will be significantly less than the melt point of the metal particles and, perhaps, less than one half the melt point of the particles considered on an absolute temperature scale (in Kelvin). Generally, $T_{MAX}$ will be greater than room temperature (considered 20° C. herein) and less than 300° C. Comparatively, the melt point of Ag, Au, and Cu particles in a nanometer or micron size range will commonly range between approximately 950° C. to 1100° C. To provide a still further example, $T_{MAX}$ may be between approximately 170° C. and 300° C. in an embodiment. In still further embodiments, $T_{MAX}$ may be greater than or less than the aforementioned range, providing that $T_{MAX}$ (in conjunction with the other process parameters) is sufficient to induce sintering of the metal particles without liquefaction of the metal particles.

A multistage heating schedule can be employed during the sintering process. In this case, the multistage heating schedule may entail heating the partially-fabricated air cavity packages (and base flange panel 60 (FIG. 3) when the air cavity packages are produced utilizing a panel-level fabrication process such as that previously described) to a first temperature ($T_1$) less than $T_{MAX}$ for a first time period, gradually increasing or ramping-up the temperature process to $T_{MAX}$, and then maintaining $T_{MAX}$ for a second time period. A cool down period may follow. In one embodiment, and by way of non-limiting example only, $T_1$ may range from approximately 100 to 200° C., while $T_{MAX}$ is greater than $T_1$ and ranges from approximately 170 to 280° C. As discussed below, the process parameters employed may or may not be controlled to fully decompose any organic material from the metal particle-containing precursor layers (e.g., precursor layers 34', 36', 38', 46' shown in FIG. 3) during the sintering process.

In at least some implementations of the package fabrication method, a controlled convergent pressure or compressive force is applied across the partially-fabricated air cavity packages during the sintering process. When applied, the convergent pressure can be delivered as a substantially constant force or, instead, varied in accordance with a time-based or temperature-based schedule. Any suitable mechanism can be utilized to apply the desired convergent pressure including bulk weights, resilient bias devices (e.g., spring-loaded plungers or pins), clamps, hydraulic presses, and the like. The pressure applied may be selected based upon various factors including the desired final thickness of the sintered bond layers, the desired porosity of the sintered bond layers, and the composition of the metal particle-containing precursor layers. In one embodiment, and by way of non-limiting example only, a maximum pressure ($P_{MAX}$) ranging between about 0.5 and about 20 megapascal (Mpa) is applied during the sintering process. In other embodiments, $P_{MAX}$ may be greater than or less than the aforementioned range, if pressure is applied during the sintering process.

As indicated briefly above, the sintered bond layers produced pursuant to the above-described metal sintering process may be composed predominately of one or more sintered metals. Again, the sintered bond layers may or may not contain organic materials. In one embodiment, the sintered bond layers consist essentially of one or more metals (e.g., essentially pure Cu or essentially pure Ag) and are essentially free of organic material (that is, contain less than 1 wt % of organic materials). In other embodiments, the sintered bond layers may contain resin or other organic fillers. For example, in another implementation, the sintered bond layers may contain organic materials that increase pliability, such as an epoxy, to reduce the likelihood of crack formation and propagation across thermal cycles. Depending upon the desired final composition of the sintered bond layers, the parameters of the sintering process may be controlled to decompose organic materials from the metal particle-containing precursor layers, in whole or in part. Additionally, the sintered bond layers may be produced to have a desired porosity, which may range from 0% to 30% by volume in an embodiment. In another embodiment, the sintered bond layers may be formed to each have a porosity of less than 1% by volume. Finally, the thickness of the sintered bond layers will vary amongst embodiments, but may range between about 5 μm and about 100 μm and, preferably, between about 15 μm and about 35 μm in one exemplary and non-limiting embodiment. In another embodiment wherein the sintered bond layers are composed of essentially pure Ag or Cu, the sintered bond layers may have a thickness range from about 40 μm to about 100 μm.

Figure 4:
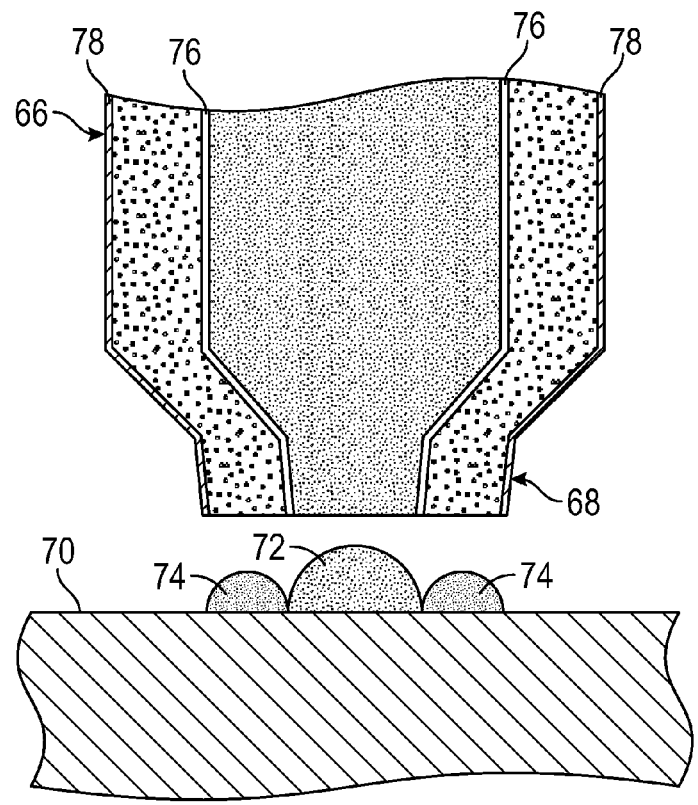
FIG. 4 is a cross-sectional view of an exemplary dispense tool (partially shown) suitable for co-depositing a wet state sinter precursor material along with one or more sinter containment beads.

Examples of Application of Sinter Containment Beads Around Perimeters of Sintered Bond Layers Referring briefly once again to FIG. 1, sinter containment beads 56, 58 may be formed along the peripheries of sintered bond layers 34, 36 in embodiments wherein gradual migration of sintered bond layers 34, 36 is of concern. When present, sinter containment beads 56, 58 can be formed in conjunction with application of the metal particle-containing precursor layers, after application of the precursor layers and prior to sintering, or after application of the precursor layers and after sintering. In one approach, sinter containment beads 56, 58 are co-deposited with the dispensed metal particle-containing precursor material utilized to form sintered bond layers 34, 36. FIG. 4 is a cross-sectional view of a specialized dispense tool 66, which can be utilized to facilitate such a co-deposition process. Dispense tool 66 includes a nozzle portion 68, which is guided along a surface 70 of a package component (e.g., an upper surface of base flange 28 or window frame 26) to co-deposit a sinter precursor bead 72 along with two sinter containment beads 74. The nozzle portion 68 includes an inner channel (defined by channel walls 76) configured to carry the material for the sinter precursor bead 72, and outer channels (defined by channel walls 76, 78) configured to carry the material for sinter containment beads 74. Sinter containment beads 74 laterally border or flank sinter precursor bead 72 to provide the desired containment function. Sinter precursor bead 72 may be composed of an Au-, Ag-, or Cu-filled paste in an embodiment, while containment beads 74 are each composed of an epoxy. In further embodiments, dispense tool 66 can be modified to deposit only a single sinter containment bead 74 in conjunction with sinter precursor bead 72. Similarly, the relative dimensions of the openings in nozzle portion 68 can be modified to adjust the relative widths of sinter precursor bead 72 and sinter containment beads 74. Dispense tool 66 or a similar tool can also be utilized to deposit sinter containment bead 58 (FIG. 1), when provided. Various other methods for depositing sinter containment beads can be also be employed in further embodiments, or the air cavity packages may be produced without sinter containment beads.

Further Description of Multipart Window Frames and Additional Examples Thereof

Figure 5:
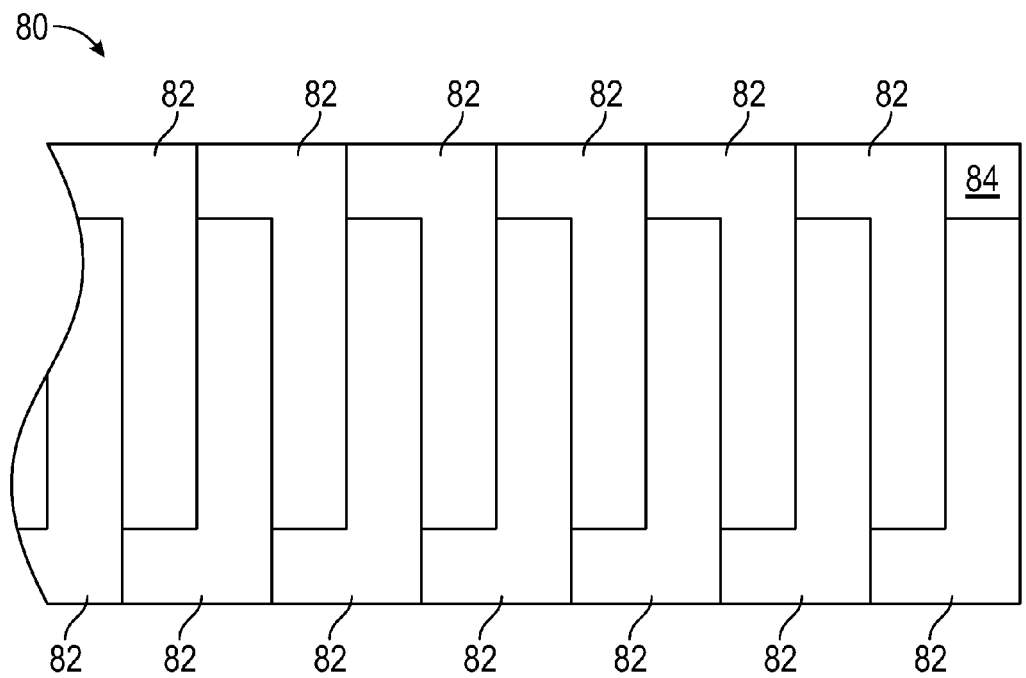
FIG. 5 is a top-down or planform view of a dielectric sheet (partially shown) over which an exemplary repeating geometric pattern is superimposed to illustrate one manner in which the dielectric sheet can be singulated into multiple window frame pieces in a cost effective, low scrap manner.
Figure 6:
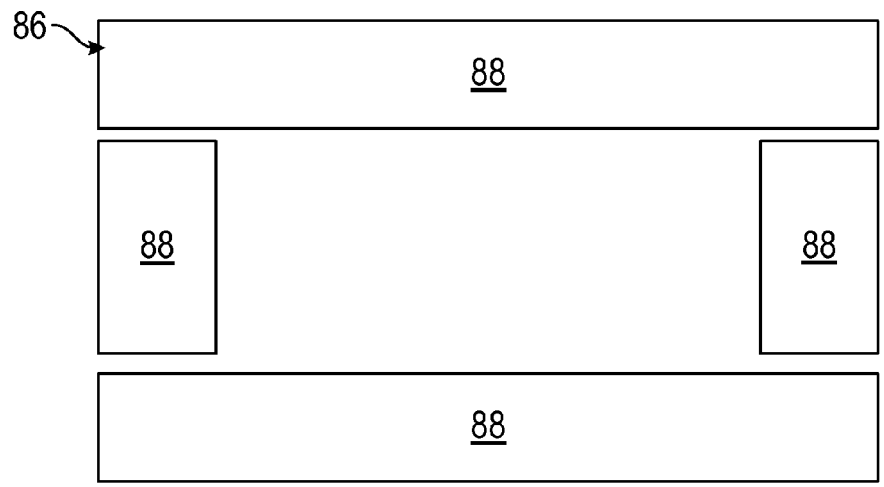
FIG. 6 is a top-down or planform view of a multipart window frame assembled from multiple straight parts, which can be produced from an elongated strip of dielectric material, as illustrated in accordance with a further exemplary embodiment of the present disclosure.

Further reductions in manufacturing costs may potentially be achieved through the incorporation of multipart window frames into the air cavity packages. For example, in the case of air cavity package 20, L-shaped window frame pieces 52, 54 can be produced in conjunction with a relatively large number of identical window frame pieces 52, 54 from a larger body (e.g., sheet or strip) of window frame material. In this regard, FIG. 5 illustrates a portion of strip or sheet 80 of window frame material onto which a singulation pattern for window frame pieces 82 (which may include window frame pieces 52, 54) has been overlaid. As can be seen, window frame pieces 82 occupy the substantial entirety of sheet 80 such that only a relatively small unused area 84 of sheet 80 remains as scrap. In further embodiments, window frame pieces 82 may assume other shapes, which may or may not include multiple different geometric patterns, providing that the cumulative scrap area across sheet 80 is minimized. As a still further possibility, the window frame material may be provided in bar or strip form. In this case, a given multipart window frame may assembled from multiple discrete pieces each assuming the form of a single straight wall. Consider, for example, FIG. 6 setting-forth a generalized, planform view of a multipart window frame 86 including four straight or block-like window frame pieces 88. Due to the straight, bar-like form factors of pieces 88, window frame pieces 88 can be cut from a common strip of a suitable material with essentially zero scrap. Window frame pieces 88 can then be assembled to form generally rectangular window frame 86, as generally shown in FIG. 6.

Figure 7:
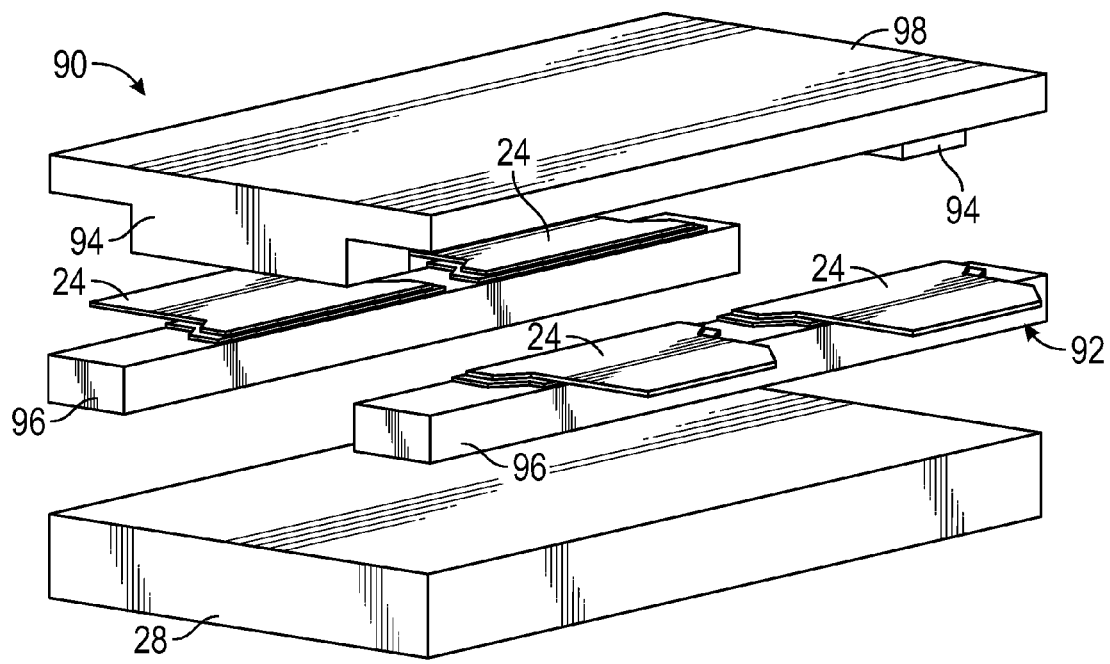
FIG. 7 is an exploded view of an air cavity package having a multipart window frame including one or more walls integrally formed with a cover piece, as illustrated in accordance with a further exemplary embodiment of the present disclosure.

In further embodiments, one or more walls of the multipart window frame may be integrally formed with another component of an air cavity package, such as a cover piece or a base flange of the package. To further illustrate this point, FIG. 7 provides an exploded view of an air cavity package 90, as illustrated in accordance with a further exemplary embodiment of the present disclosure (package bond layers not shown). In many respects, air cavity package 90 is similar to air cavity package 20 shown in FIGS. 1-2; like reference numerals are thus utilized to denote like structural elements to the extent appropriate. As does air cavity package 20 (FIGS. 1-2), air cavity package 90 includes a multipart window frame 92 assembled from a plurality of window frame pieces 94, 96. However, in this particular example, multipart window frame 92 is assembled from four mating pieces 94, 96, two of which (window frame pieces 94) are integrally formed with cover piece 98. By integrally forming selected window frame pieces 92 with cover piece 98 in this manner, the number of window frame joints included within air cavity package 90 is minimized. This, in turn, favorably reduces the number of potential leakage paths from the air cavity and reduces the volume of material required to seal the window frame joints. As an additional benefit, the window frame pieces that are not integrally formed with cover piece 98 (window frame pieces 96) have substantially straight or block-like form factors and, consequently, can be cut from or otherwise produced with a bar or strip of material in a cost efficient, low scrap manner. The overall production cost and performance of air cavity package 90 can be optimized as a result.

Figure 8:
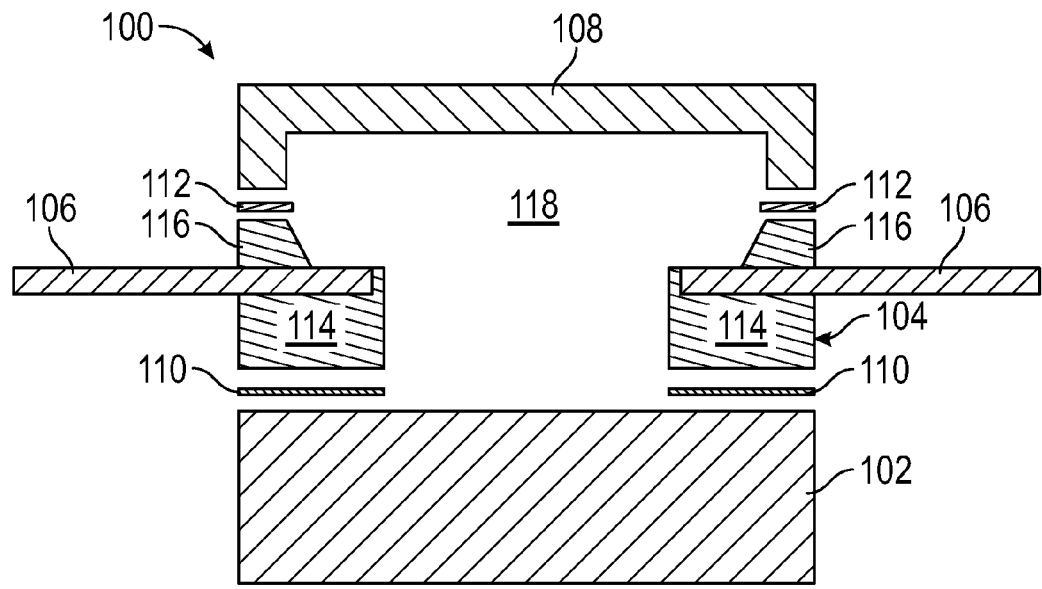
FIG. 8 is an exploded cross-sectional view of a leaded air cavity package including one or more sinter bond layers and a plurality of leads, which are embedded through (e.g., overmolded into) a window frame, as illustrated in accordance with a further exemplary embodiment of the present disclosure.

Additional Examples of Air Cavity Packages Including Sintered Bond Layers and/or Multipart Window Frames FIG. 8 is an exploded cross-sectional view of a leaded air cavity package 100, as illustrated in accordance with a still further embodiment of the present disclosure. As was the case previously with air cavity package 20 (FIGS. 1-2), air cavity package 100 includes a base flange 102, a window frame 104, a plurality of package leads 106, and a cover piece 108. A sintered bond layer 110 joins window frame 104 to base flange 102, and an additional bond layer 112 joins cover piece 108 to window frame 104. An air cavity 118 is enclosed within air cavity package 100 when fully assembled. One or more microelectronic devices (not shown) may be installed within air cavity 118 prior to attachment of cover piece 108. In this particular example, package leads 106 are embedded within window frame 104, which may or may not have a multipart construction. In this regard, window frame 104 may be produced from a dielectric material, such as plastic or another organic material, which is molded around package leads 106. In other embodiments, package leads 106 may be press-fit into openings molded into or otherwise provided in window frame 104 or package leads 106 may be joined to frame 104 utilizing a sinter attach process of the type described above. In the embodiment of FIG. 8, window frame 104 thus includes: (i) a lower dielectric portion 114, which is positioned beneath package leads 106 and which is bonded to base flange 102 by sintered bond layer 110, and (ii) an upper dielectric portion 116, which is positioned over leads 106 and which is bonded to cover piece 108 by additional bond layer 112. Due to the provision of upper dielectric portion 116, additional bond layer 112 can also be formed as a sintered bond layer, if so desired, without electrical bridging of package leads 106. Such a construction may help further reduce package fabrication costs by minimizing the number of bond layers and number of processing steps required to complete leaded air cavity package 100.

Figure 9:
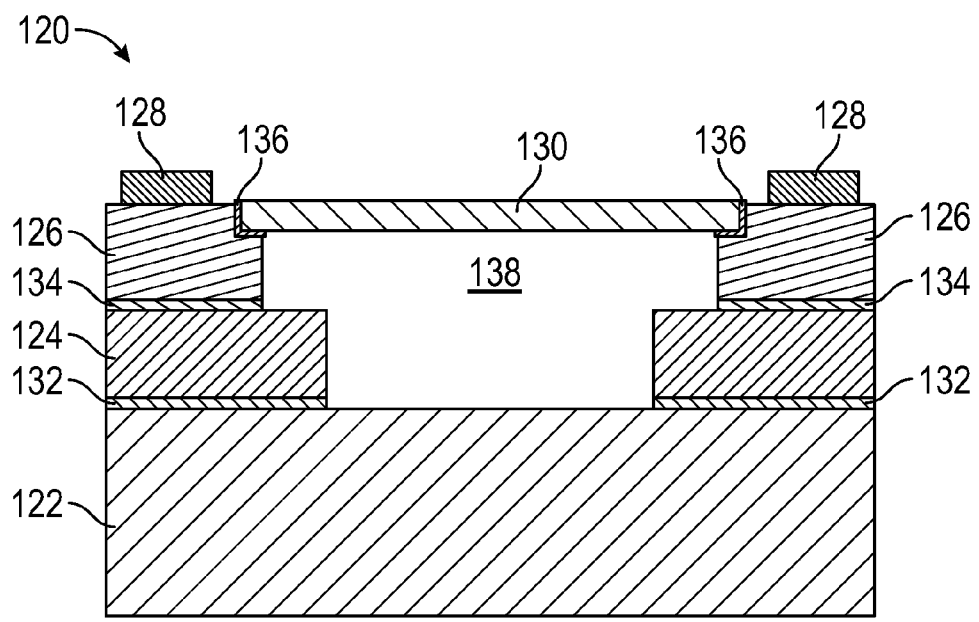
FIG. 9 is a cross-sectional view of a no-lead air cavity package including one or more sinter bond layers and well-suited for production by panel level processing, as illustrated in accordance with a yet further exemplary embodiment of the present disclosure.

FIG. 9 is a cross-sectional view of a no-lead air cavity package 120, as illustrated in accordance with a yet further embodiment of the present disclosure. As does leaded air cavity package 20 (FIGS. 1-3) and leaded air cavity package 100 (FIG. 8), no-lead air cavity package 120 includes a base flange 122, a window frame 124, and a cover piece 130, which are bonded in a stacked relationship. However, air cavity package 120 lacks laterally-projecting leads and instead includes electrically-conductive, no-lead structures 126 having terminals 128. Non-illustrated dielectric structures are disposed between electrically-conductive structures 126 to provide electrical isolation about the perimeter of package 120. The non-illustrated dielectric structures can be integrally formed with window frame 124, integrally formed with cover piece 130, or may instead be discrete structures. A first sintered bond layer 132 joins base flange 122 to window frame 124, and a second sintered bond layer 134 joins window frame 124 to electrically-conductive no-lead structures 126 and to the non-illustrated dielectric structures therebetween. A non-conductive bond layer 136 also joins cover piece 130 to an inner shelf or ledge provided on no-lead structures 126.

As further shown in FIG. 9, an air cavity 138 is sealingly enclosed within air cavity package 120. Prior to attachment of cover piece 130, one or more microelectronic devices (not shown) are installed within air cavity 138 and electrically interconnected with the bond pad shelves of electrically-conductive no-lead structures 126 by, for example, wire bonding. As no-lead air cavity package 120 lacks laterally-projecting leads, a greater number of air cavity packages can be produced in parallel in a given area utilizing a panel-level fabrication process similar to that described above in conjunction with FIG. 3. In this regard, base flange 122, window frame 124, and possibly electrically-conductive no-lead structures 126 may be integrally connected with other base flanges, window frames, and other no-lead structures. The aforementioned components may then be stacked, joined utilizing globally-applied sinter bond layers, and ultimately singulated to produce no-lead air cavity package 120 along with a plurality of additional air cavity packages during the package manufacturing process.

CONCLUSION

There has thus been provided air cavity packages and methods for producing air cavity packages containing unique structural features, such sinter-bonded components and multipart window frames. In certain embodiments, a low temperature sinter bond process is utilized to bond the base flange and window frame, to bond the window frame and package leads (in the case of a leaded package), and/or to bond the base flange and the microelectronic device or devices contained within the package. Prior to sintering, one or more sinter precursor layers are applied to selected interfaces of the air cavity packages utilizing a wet or dry state application technique. For example, in certain embodiments, metal particle-containing precursor layers may be applied to selected surfaces of a base flange and/or a window frame as screen printed layer, as an attached film, or as a combination thereof. The sinter precursor layers contain metal particles, such as Ag, Cu, or Au metal particles in the nanometer and/or micron size range, which are then densified during the subsequently-performed low temperature sintering process. As the sintering process is carried-out at relatively low temperatures, material constraints placed on the package components are eased and the above-described issues associated with high temperature processing are mitigated to bring about a corresponding reduction in fabrication costs. In certain implementations, the sintering process and other process steps are performed on a panel level to further reduce the cost and duration of air cavity package manufacture. In addition to or as alternative to low temperature sintering, reductions in manufacturing costs can be realized through the incorporation of multipart window frames into the air cavity packages.

In one group of embodiments, a method for fabricating air cavity packages includes the step or process of forming a first metal particle-containing precursor layer between a base flange and a window frame, such as a multipart window frame, positioned over the base flange. The window frame or window frame parts may be composed of a dielectric organic material in an implementation. A second metal particle-containing precursor layer is further formed between the base flange and a microelectronic device positioned over the base flange. The first and second metal particle-containing precursor layers each include metal particles having a melt point. The and second first metal particle-containing precursor layer may also contain organic materials, which entirety decompose, partially decompose, or not decompose during the subsequently-performed low temperature sintering process. The first and second metal particle-containing precursor layers are then sintered substantially concurrently at a maximum processing temperature less than a melt point of metal particles within the layers to produce a first sintered bond layer from the first precursor layer joining the window frame to the base flange and to produce a second sintered bond layer from the second precursor layer joining the microelectronic device to the base flange. In one embodiment, the maximum processing temperatures is less than half the melt point of the metal particles contained within the precursor layers and perhaps less than 300° C. In embodiments wherein the base flange remains interconnected with a plurality of other base flanges as a base flange panel following sintering of the first metal particle-containing layer, the air cavity package fabrication method may further include the step or process of singulating the base flange panel to separate the base flange from the plurality of other base flanges.

In another embodiment, an air cavity package fabrication method includes positioning multiple window frame pieces over a base flange to assemble a multipart window frame having a plurality of window frame joints. The plurality of window frame joints are sealed, and the multiple window frame pieces are bonded to the base flange during or after positioning and sealing. In certain embodiments, the step or process of sealing may include: (i) forming metal particle-containing precursor layers between the multipart window frame at the plurality of window frame joints, the metal particle-containing precursor layers containing metal particles having a melt point; and (ii) sintering the metal particle-containing precursor layers at a maximum processing temperature less than the melt point of the metal particles to transform the metal particle-containing precursor layers into a sintered bond layer sealing the plurality of window frame joints. In some embodiments, at least one of the window frame pieces may have a substantially L-shaped planform geometry. Additionally or alternatively, the method may include attaching a cover piece to the window frame opposite the base flange to enclose a sealed air cavity located within air cavity package wherein at least one of the multiple window frame pieces is integrally formed with the cover piece.

Embodiments of an air cavity package have also been provided. In one embodiment, the air cavity package includes a base flange, a window frame positioned over the base flange, an air cavity surrounded by the window frame, and a first sintered bond layer joining the window frame to the base flange. In certain implementations, the window frame may include multiple window frame pieces positioned over a base flange and each bonded to the base flange by the first sintered bond layer. In such embodiments, the joints or interfaces between the window frame pieces may be sealed utilizing a sintered material, which may be similar or substantially identical in composition to the first sintered bond layer. In other embodiments, the air cavity package may further include a plurality of package leads and a second sintered bond layer, which joins the package leads to the window frame opposite the base flange.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A method for fabricating an air cavity package, comprising:
   forming a first metal particle-containing precursor layer between a base flange and a window frame positioned over the base flange;
   forming a second metal particle-containing precursor layer between the base flange and a microelectronic device positioned over the base flange, each containing metal particles of the first metal particle-containing precursor layer and the second metal particle-containing precursor layer having one or more melt points; and
   sintering the first metal particle-containing precursor layer and second metal particle-containing precursor layer substantially concurrently at a maximum processing temperature less than the one or more melt points of the metal particles to produce a first sintered bond layer from the first metal-particle containing precursor layer joining the window frame to the base flange and to produce a second sintered bond layer from the second metal-particle containing precursor layer joining the microelectronic device to the base flange.

2. The method of claim 1 wherein the base flange remains interconnected with a plurality of other base flanges as a base flange panel following the sintering of the first metal particle-containing layer, and wherein the method further comprises singulating the base flange panel to separate the base flange from the plurality of other base flanges after the sintering.

3. The method of claim 1 further comprising selecting the metal particles to comprise at least one of silver particles, gold particles, and copper particles.

4. The method of claim 1 further comprising selecting the first metal particle-containing precursor layer and second metal particle-containing precursor layer to contain an organic binder in addition to the metal particles.

5. The method of claim 4 wherein sintering comprises sintering the first metal particle-containing precursor layer and second metal particle-containing layer under process conditions at which the organic binder decomposes, at least in substantial part, such that a first sintered bond layer and a second sintered bond layer are essentially free of the organic binder.

6. The method of claim 1 further comprising:
   forming a third metal particle-containing precursor layer between the window frame and a lead positioned over the window frame opposite the base flange; and
   the sintering comprises sintering the third metal particle-containing precursor layer to produce a third sintered bond layer joining the window frame and the lead.

7. The method of claim 6 wherein sintering comprises sintering the first metal particle-containing precursor layer, second metal particle-containing precursor layer, and third metal particle-containing precursor layer substantially concurrently utilizing a common sintering process.

8. The method of claim 1 further comprising selecting the window frame to include a plurality of leads embedded through the window frame.

9. The method of claim 1 further comprising depositing a sinter containment bead along a periphery of the first sintered bond layer.

10. The method of claim 1 further comprising assembling the window frame from multiple widow frame pieces, each window frame piece bonded to the base flange following the sintering of the first metal particle-containing precursor layer.

11. The method of claim 10 further comprising:
forming additional metal particle-containing precursor layers at interfaces between the multiple window frame pieces; and
sintering the additional metal particle-containing precursor layers to produce sintered bond joints at the interfaces between the multiple window frame pieces.

12. A method for fabricating an air cavity package, comprising:
positioning multiple window frame pieces over a base flange to assemble a multipart window frame having a plurality of window frame joints;
sealing the plurality of window frame joints, the sealing comprising:
forming metal particle-containing precursor layers between the window frame pieces at the plurality of window frame joints, the metal particle-containing precursor layers containing metal particles having one or more melt points;
sintering the metal particle-containing precursor layers at a maximum processing temperature less than a lowest melt point of the one or more melt points of the metal particles to transform the metal particle-containing precursor layers into sintered bond layers sealing the plurality of window frame joints; and
during or after the positioning and the sealing, bonding the window frame pieces to the base flange.

13. The method of claim 12 wherein at least one of the window frame pieces has a substantially L-shaped planform geometry.

14. The method of claim 12 further comprising attaching a cover piece to the window frame opposite the base flange to enclose a sealed air cavity located within the air cavity package, at least one of the multiple window frame pieces integrally formed with the cover piece.

\* \* \* \* \*